(12) United States Patent
Liu et al.

(10) Patent No.: US 10,886,119 B2
(45) Date of Patent: Jan. 5, 2021

(54) AROMATIC UNDERLAYER

(71) Applicant: Rohm and Haas Electronic Materials LLC, Marlborough, MA (US)

(72) Inventors: Sheng Liu, Bow, NH (US); James F. Cameron, Brookline, MA (US); Shintaro Yamada, Shrewsbury, MA (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 0 days.

(21) Appl. No.: 16/502,062

(22) Filed: Jul. 3, 2019

(65) Prior Publication Data

US 2020/0058494 A1    Feb. 20, 2020

Related U.S. Application Data

(60) Provisional application No. 62/719,376, filed on Aug. 17, 2018.

(51) Int. Cl.
| | | |
|---|---|---|
| *H01L 29/08* | (2006.01) |
| *H01L 35/24* | (2006.01) |
| *H01L 51/00* | (2006.01) |
| *H01L 23/62* | (2006.01) |
| *H01L 21/02* | (2006.01) |
| *C08L 61/30* | (2006.01) |
| *C08L 65/00* | (2006.01) |
| *H01L 21/3213* | (2006.01) |

(52) U.S. Cl.
CPC ........ *H01L 21/02118* (2013.01); *C08L 61/30* (2013.01); *C08L 65/00* (2013.01); *H01L 21/02532* (2013.01); *H01L 21/3213* (2013.01); *C08L 2203/206* (2013.01)

(58) Field of Classification Search
None
See application file for complete search history.

(56) References Cited

U.S. PATENT DOCUMENTS

| | | | |
|---|---|---|---|
| 8,450,048 B2 | 5/2013 | Hatakeyama et al. | |
| 8,652,757 B2 | 2/2014 | Hatakeyama et al. | |
| 8,846,846 B2 | 9/2014 | Kinsho et al. | |
| 9,316,913 B2 | 4/2016 | Echigo et al. | |
| 2003/0092852 A1* | 5/2003 | Ogura ................. | C07D 311/78 525/403 |
| 2011/0311920 A1 | 12/2011 | Kinsho et al. | |
| 2012/0064725 A1* | 3/2012 | Kinsho ................... | B05D 1/40 438/703 |
| 2014/0319097 A1* | 10/2014 | Kim .................... | C07D 491/107 216/47 |
| 2016/0284559 A1 | 9/2016 | Kikuchi et al. | |
| 2017/0018436 A1* | 1/2017 | Hatakeyama ........... | C08G 8/10 |
| 2017/0183531 A1* | 6/2017 | Kori ...................... | C09D 155/00 |
| 2018/0246409 A1* | 8/2018 | Toida ...................... | G03F 7/38 |
| 2019/0258163 A1* | 8/2019 | Kim ...................... | C08G 61/124 |

FOREIGN PATENT DOCUMENTS

| | | |
|---|---|---|
| JP | 2008065081 A | 3/2008 |
| JP | 2009129703 A | 6/2009 |
| WO | 2015163182 A1 | 10/2015 |
| WO | 2015178074 A1 | 11/2015 |
| WO | 2016132784 A1 | 8/2016 |
| WO | WO-2018070785 A1 * | 4/2018 ........... G03F 7/0048 |

OTHER PUBLICATIONS

Amou, et al., "Synthesis of Regiocontrolled Polymer Having 2-Naphthol Unit by CuCl-amine Catalyzed Oxidative Coupling Polymerization", Polym. Sci.: Part A: Polym. Chem. 1999, pp. 3702-3709, vol. 37.

Morgen, et al., "Enantioselective Synthesis of Binaphthyl Polymers Using Chiral Asymmetric Phenolic Coupling Catalysts: Oxidative Coupling and Tandem Glaser/Oxidative Coupling", J. Org. Chem. 2007, pp. 6171-6182, vol. 72.

Search report for corresponding Taiwan Application No. 108126723 dated Jun. 22, 2020.

\* cited by examiner

*Primary Examiner* — Jessica Whiteley
(74) *Attorney, Agent, or Firm* — Jonathan D. Baskin

(57) ABSTRACT

Curable homopolymers formed from monomers having two 2-naphthol moieties are useful as underlayers in semiconductor manufacturing processes.

11 Claims, No Drawings

AROMATIC UNDERLAYER

The present invention relates generally to the field of manufacturing electronic devices, and more specifically to the field of materials for use as underlayers in semiconductor manufacture.

It is well-known in lithographic processes that a resist pattern can collapse due to surface tension from the developer used if the resist pattern is too tall (high aspect ratio). Multilayer resist processes (such as three- and four-layer processes) have been devised which can address this issue of pattern collapse where a high aspect ratio is desired. Such multilayer processes use a resist top layer, one or more middle layers, and a bottom layer (or underlayer). In such multilayer resist processes, the top photoresist layer is imaged and developed in typical fashion to provide a resist pattern. The pattern is then transferred to the one or more middle layers, typically by etching. Each middle layer is selected such that a different etch process is used, such as different plasma etches. Finally, the pattern is transferred to the underlayer, typically by etching. Such middle layers may be composed of various materials while the underlayer materials are typically composed of high carbon content materials. The underlayer material is selected to provide desired antireflective properties, planarizing properties, as well as etch selectivity.

The incumbent technologies for underlayer include chemical vapor deposited (CVD) carbon and solution processed high-carbon content polymers. The CVD materials have several significant limitations including high cost of ownership, inability to form a planarizing layer over topography on a substrate, and high absorbance at 633 nm which is used for pattern alignment. For these reasons, the industry has been moving to solution processed high-carbon content materials as underlayers. The ideal underlayer needs to meet the following properties: capable of being cast onto a substrate by a spin-coating process, thermally-set (cured) upon heating with low out-gassing and sublimation, soluble in common processing solvents for good equipment compatibility, have appropriate n and k values to work in conjunction with currently used silicon hardmask and bottom antireflectant (BARC) layers to impart low reflectivity necessary for photoresist imaging, and be thermally stable up to >400° C. so as to not be damaged during subsequent CVD processes, for example, silicon-oxy-nitride (SiON), silicon nitride silicon oxide, and the like.

Aromatic building blocks are typically used to provide underlayer materials having the desired thermal stability. However, underlayer materials having a high aromatic carbon content tend to suffer from poor solubility in common processing solvents. Various attempts have been made to prepare high aromatic content underlayer materials using conventional novolac polymerization processes which introduce a hydroxyl group and an aliphatic carbon into the polymer. There remains a need for underlayer materials that cure at relatively lower temperatures, have good solubility in common processing solvents and do not suffer from metal catalyst, boron, halogen, and/or phosphorus contamination.

The present invention provides a method comprising: (a) providing an electronic device substrate; (b) coating a layer of a coating composition comprising one or more curable compounds on a surface of the electronic device substrate, wherein the one or more curable compounds is a polymer comprising repeating units of formula (1)

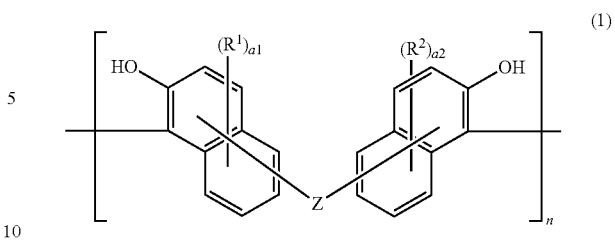

wherein Z is a covalent chemical bond or a divalent linking group chosen from O, C(=O), S, S(=O), S(=O)$_2$, N(R), $C_{1-100}$-hydrocarbylene, substituted $C_{1-100}$-hydrocarbylene, —O—($C_{1-20}$-alkylene-O—)$_{m1}$, —O—($C_{5-60}$-arylene-O—)$_{m2}$, and C(R$^3$)(R$^4$); R is chosen from H, $C_{1-20}$-alkyl, $C_{5-30}$-aryl, and $C_{2-20}$-unsaturated aliphatic moiety; each R$^1$ and each R$^2$ are independently chosen from H, OR, $C_{1-30}$-hydrocarbyl, substituted $C_{1-30}$-hydrocarbyl, —C(=O)—O—R$^5$, SR, S(=O)R, S(=O)$_2$R N(R$^5$)(R$^6$), and N(R7)C(=O)R$^5$; one R$^1$ and one R$^2$ and Z may be taken together along with the atoms to which they are attached to form a 5 to 6-membered ring; R$^3$ and R$^4$ are independently chosen from $C_{1-20}$-alkyl and $C_{5-30}$-aryl; R$^3$ and R$^4$ may be taken together with the carbon to which they are attached to form a 5- or 6-membered ring which may be fused to one or more aromatic rings, and which 5- or 6-membered ring is optionally substituted; R$^5$ and R$^6$ are independently $C_{1-20}$-alkyl or $C_{5-30}$-aryl; R$^7$ is H or R$^6$; R$^5$ and R$^6$ may be taken together along with the atoms to which they are attached to form a 5- to 6-membered ring; each of a1 and a2 is from 0 to 5, each of m1 and m2=1 to 100; and n=2 to 1000; (c) curing the layer of the curable compound to form an underlayer; (d) coating a layer of a photoresist on the underlayer; (e) exposing the photoresist layer to actinic radiation through a mask; (f) developing the exposed photoresist layer to form a resist pattern; and (g) transferring the pattern to the underlayer to expose portions of the electronic device substrate.

Also provided by the present invention is an electronic device comprising an electronic device substrate having a layer of a polymer comprising as polymerized units one or more curable compounds on a surface of the electronic device substrate, wherein the one or more curable compounds is a polymer comprising repeating units of formula (1)

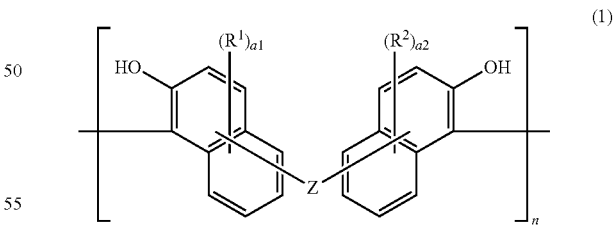

wherein Z is a covalent chemical bond or a divalent linking group chosen from O, C(=O), S, S(=O), S(=O)$_2$, N(R), $C_{1-100}$-hydrocarbylene, substituted $C_{1-100}$-hydrocarbylene, —O—($C_{1-20}$-alkylene-O—)$_{m1}$, —O—($C_{5-60}$-arylene-O—)$_{m2}$, and C(R$^3$)(R$^4$); R is chosen from H, $C_{1-20}$-alkyl, $C_{5-30}$-aryl, and $C_{2-20}$-unsaturated aliphatic moiety; each R$^1$ and each R$^2$ are independently chosen from H, OR, $C_{1-30}$-hydrocarbyl, substituted $C_{1-30}$-hydrocarbyl, —C(=O)—O—R$^5$, SR, S(=O)R, S(=O)$_2$R, N(R$^5$)(R$^6$), and N(R7)C(=O)R$^5$; one R$^1$ and one R$^2$ and Z may be taken together along with the atoms to which they are attached to form a 5 to 6-membered ring; R³ and R⁴ are independently chosen from C$_{1-20}$-alkyl and C$_{5-30}$-aryl; R³ and R⁴ may be taken together with the carbon to which they are attached to form a 5- or 6-membered ring which may be fused to one or more aromatic rings, and which 5- or 6-membered ring is optionally substituted; R⁵ and R⁶ are independently C$_{1-20}$-alkyl or C$_{5-30}$-aryl; R⁷ is H or R⁶; R⁵ and R⁶ may be taken together along with the atoms to which they are attached to form a 5- to 6-membered ring; each of a1 and a2 is from 0 to 5; each of m1 and m2=1 to 100; and n=2 to 1000.

The present invention further provides a polymer comprising repeating units of formula (1)

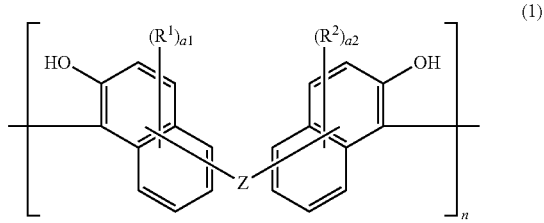

wherein Z is a covalent chemical bond or a divalent linking group chosen from O, C(=O), S, S(=O), S(=O)$_2$, N(R), C$_{1-100}$-hydrocarbylene, substituted C$_{1-100}$-hydrocarbylene, —O—(C$_{1-20}$-alkylene-O—)$_{m1}$, —O—(C$_{5-60}$-arylene-O—)$_{m2}$, and C(R³)(R⁴); R is chosen from H, C$_{1-20}$-alkyl, C$_{5-30}$-aryl, and C$_{2-20}$-unsaturated aliphatic moiety; each R¹ and each R² are independently chosen from H, OR, C$_{1-30}$-hydrocarbyl, substituted C$_{1-30}$-hydrocarbyl, —C(=O)—O—R⁵, SR, S(=O)R, S(=O)$_2$R, N(R⁵)(R⁶), and N(R7)C(=O)R⁵; one R¹ and one R² and Z may be taken together along with the atoms to which they are attached to form a 5 to 6-membered ring; R³ and R⁴ are independently chosen from C$_{1-20}$-alkyl and C$_{5-30}$-aryl; R³ and R⁴ may be taken together with the carbon to which they are attached to form a 5- or 6-membered ring which may be fused to one or more aromatic rings, and which 5- or 6-membered ring is optionally substituted; R⁵ and R⁶ are independently C$_{1-20}$-alkyl or C$_{5-30}$-aryl; R⁷ is H or R⁶; R⁵ and R⁶ may be taken together along with the atoms to which they are attached to form a 5- to 6-membered ring; each of a1 and a2 is from 0 to 5; each of m1 and m2=1 to 100; and n=2 to 1000.

Also provided by the present invention is a process for filling a gap (or aperture), comprising: (a) providing a semiconductor substrate having a relief image on a surface of the substrate, the relief image comprising a plurality of gaps to be filled; (b) applying a coating layer of one or more polymers described above over the relief image; and (c) heating the coating layer at a temperature sufficient to cure the coating layer.

It will be understood that when an element is referred to as being "on" another element, it can be directly adjacent to the other element or intervening elements may be present therebetween. In contrast, when an element is referred to as being "directly on" another element, there are no intervening elements present. As used herein, the term "and/or" includes any and all combinations of one or more of the associated listed items.

It will also be understood that although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

As used throughout this specification, the following abbreviations shall have the following meanings, unless the context clearly indicates otherwise: ° C.=degree Celsius; g=gram; mg=milligram; L=liter; mL=milliliter; Å=angstrom; nm=nanometer; µm=micron=micrometer; mm=millimeter; sec.=second; min.=minute; hr.=hour; DI=deionized; and Da=dalton. The abbreviation "wt %" refers to percent by weight based on the total weight of a referenced composition, unless otherwise specified. Unless otherwise specified, all amounts are wt % and all ratios are molar ratios. All numerical ranges are inclusive and combinable in any order, except where it is clear that such numerical ranges are constrained to add up to 100%. The articles "a", "an" and "the" refer to the singular and the plural.

"Alkyl" refers to linear, branched and cyclic alkyl unless otherwise specified. "Alkenyl" refers to linear, branched and cyclic alkenyl unless otherwise specified. "Halogen" refers to fluorine, chlorine, bromine, and iodine. Unless otherwise noted, "alkyl" includes "heteroalkyl". The term "heteroalkyl" refers to an alkyl group with one or more heteroatoms, such as nitrogen, oxygen, sulfur, phosphorus, replacing one or more carbon atoms within the radical, for example, as in an ether or a thioether. In one preferred embodiment, "alkyl" does not include "heteroalkyl". If no number of carbons is indicated for any alkyl or heteroalkyl, then 1-20 carbons are contemplated. If no number of carbons is indicated for any alkenyl or alkynyl, then 2-20 carbons are contemplated. "Aryl" includes aromatic carbocycles and aromatic heterocycles. It is preferred that aryl moieties are aromatic carbocycles. "Substituted aryl" refers to any aryl moiety having one or more of its hydrogens replaced with one or more substituents chosen from halogen, C$_{1-6}$-alkyl, halo-C$_{1-6}$-alkyl, C$_{1-6}$-alkoxy, halo-C$_{1-6}$-alkoxy, phenyl, and phenoxy, preferably from halogen, C$_{1-6}$-alkyl, halo-C$_{1-4}$-alkyl, C$_{1-6}$-alkoxy, halo-C$_{1-4}$-alkoxy, and phenyl, and more preferably from halogen, C$_{1-6}$-alkyl, C$_{1-6}$-alkoxy, phenyl, and phenoxy. Preferably, a substituted aryl has from 1 to 3 substituents, and more preferably 1 or 2 substituents. The terms "hydrocarbyl" and "hydrocarbylene" refer to saturated and unsaturated aliphatic and cycloaliphatic moieties and aromatic hydrocarbon moieties, each of which may contain one or more heteroatoms chosen from O, S, and N. Preferred "hydrocarbyl" moieties are alkyl, alkenyl, alkynyl, and aryl moieties. Likewise, preferred "hydrocarbylene" moieties are alkylene, alkenylene, alkynylene, and arylene. The term "optionally substituted hydrocarbyl" or "optionally substituted hydrocarbylene" refers to substituted and unsubstituted alkyl or alkylene, substituted and unsubstituted alkene or alkenylene, substituted and unsubstituted alkynyl or alkynylene, and substituted and unsubstituted aryl or arylene. The terms "substituted hydrocarbyl" and "substituted hydrocarbylene" refer to a hydrocarbyl or hydrocarbylene moiety having one or more of its hydrogens replaced by one or more inert substituents. By the term "inert substituent" is meant any substituent that does not react during the polymerization step used to form the present polymers. Exemplary inert substituent are C$_{1-20}$-alkoxy, C$_{5-20}$-aryl, C$_{1-20}$-alkyl, C$_{2-20}$-alkenyl, C$_{2-20}$-alkynyl, hydroxyl, and halogen.

As used herein, the term "polymer" includes oligomers. The term "oligomer" refers to dimers, trimers, tetramers and other polymeric materials that are capable of further curing. By the term "curing" is meant any process, such as polymerization or condensation, that increases the overall molecular weight of the present polymers or removes solubility enhancing groups from the present polymers, or alternatively both increases the overall molecular weight and removes solubility enhancing groups. "Curable" refers to any material capable of being cured under certain conditions. As used herein, "gap" refers to any aperture on a semiconductor substrate that is intended to be filled with a gap-filling composition.

Aromatic underlayers are formed in the manufacture of electronic devices according to a method comprising: (a) providing an electronic device substrate; (b) coating a layer of a coating composition comprising one or more curable compounds on a surface of the electronic device substrate, wherein the one or more curable compounds is a polymer comprising repeating units of formula (1)

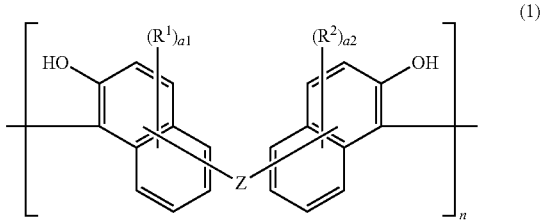

(1)

wherein Z is a covalent chemical bond or a divalent linking group chosen from O, C(=O), S, S(=O), S(=O)$_2$, N(R), $C_{1-100}$-hydrocarbylene, substituted $C_{1-100}$-hydrocarbylene, —O—($C_{1-20}$-alkylene-O—)$_{m1}$, —O—($C_{5-60}$-arylene-O—)$_{m2}$, and C(R$^3$)(R$^4$); R is chosen from H, $C_{1-20}$-alkyl, $C_{5-30}$-aryl, and $C_{2-20}$-unsaturated aliphatic moiety; each R$^1$ and each R$^2$ are independently chosen from H, OR, $C_{1-30}$-hydrocarbyl, substituted $C_{1-30}$-hydrocarbyl, —C(=O)—O—R$^5$, SR, S(=O)R, S(=O)$_2$R, N(R$^5$)(R$^6$), and N(R7)C(=O)R$^5$; one R$^1$ and one R$^2$ and Z may be taken together along with the atoms to which they are attached to form a 5 to 6-membered ring; R$^3$ and R$^4$ are independently chosen from $C_{1-20}$-alkyl and $C_{5-30}$-aryl; R$^3$ and R$^4$ may be taken together with the carbon to which they are attached to form a 5- or 6-membered ring which may be fused to one or more aromatic rings, and which 5- or 6-membered ring is optionally substituted; R$^5$ and R$^6$ are independently $C_{1-20}$-alkyl or $C_{5-30}$-aryl; R$^7$ is H or R$^6$; R$^5$ and R$^6$ may be taken together along with the atoms to which they are attached to form a 5- to 6-membered ring; each of a1 and a2 is from 0 to 5; each of m1 and m2=1 to 100; and n=2 to 1000; (c) curing the layer of the curable compound to form an underlayer; (d) coating a layer of a photoresist on the underlayer; (e) exposing the photoresist layer to actinic radiation through a mask; (f) developing the exposed photoresist layer to form a resist pattern; and (g) transferring the pattern to the underlayer to expose portions of the electronic device substrate. Next, the substrate is patterned, and the patterned underlayer is removed. In one preferred embodiment, a layer of photoresist is coated directly on the underlayer. In an alternate preferred embodiment, a layer of one or more of a silicon-containing composition, an organic antireflective composition (BARC), and a combination thereof is coated directly on the underlayer, and optionally cured, before step (d) to form a middle layer, and then a layer of photoresist is coated directly on the one or more of the silicon-containing composition layer, the BARC layer or a layer of each. When a silicon-containing middle layer is used, the pattern is transferred to the silicon-containing middle layer after step (1) and before step (g).

A wide variety of electronic device substrates may be used in the present invention, such as: packaging substrates such as multichip modules; flat panel display substrates; integrated circuit substrates; substrates for light emitting diodes (LEDs) including organic light emitting diodes (OLEDs); semiconductor wafers; polycrystalline silicon substrates; and the like, with semiconductor wafers being preferred. Such substrates are typically composed of one or more of silicon, polysilicon, silicon oxide, silicon nitride, silicon oxynitride, silicon germanium, gallium arsenide, aluminum, sapphire, tungsten, titanium, titanium-tungsten, nickel, copper, and gold. Suitable substrates may be in the form of wafers such as those used in the manufacture of integrated circuits, optical sensors, flat panel displays, integrated optical circuits, and LEDs. As used herein, the term "semiconductor wafer" is intended to encompass "a semiconductor substrate," "a semiconductor device." and various packages for various levels of interconnection, including a single-chip wafer, multiple-chip wafer, packages for various levels, or other assemblies requiring solder connections. Such substrates may be any suitable size. Preferred wafer substrate diameters are 200 mm to 300 mm, although wafers having smaller and larger diameters may be suitably employed according to the present invention. As used herein, the term "semiconductor substrate" includes any substrate having one or more semiconductor layers or structures which may optionally include active or operable portions of semiconductor devices. A semiconductor device refers to a semiconductor substrate upon which at least one microelectronic device has been or is being batch fabricated.

Optionally, a layer of an adhesion promoter may be applied to the substrate surface before the deposition of the present coating compositions, which is subsequently cured to form the underlayer. If an adhesion promoter is desired, any suitable adhesion promoter for polymer films may be used, such as silanes, preferably organosilanes such as trimethoxyvinylsilane, triethoxyvinylsilane, hexamethyldisilazane, or an aminosilane coupler such as gamma-aminopropyltriethoxysilane. Particularly suitable adhesion promoters include those sold under the AP 3000. AP 8000, and AP 9000S designations, available from Dow Electronic Materials (Marlborough, Mass.).

Coating compositions useful in the present invention comprise one or more curable compounds, wherein the curable compound is a polymer comprising repeating units of formula (1)

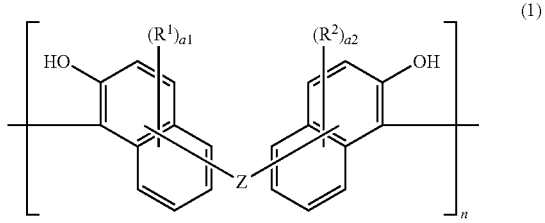

(1)

wherein Z is a covalent chemical bond or a divalent linking group chosen from O, C(=O), S, S(=O), S(=O)$_2$, N(R), $C_{1-100}$-hydrocarbylene, substituted $C_{1-100}$-hydrocarbylene, —O—($C_{1-20}$-alkylene-O—)$_{m1}$, —O—($C_{5-60}$-arylene-O—)$_{m2}$, and C(R$^3$)(R$^4$); R is chosen from H, $C_{1-20}$-alkyl, $C_{5-30}$-aryl, and $C_{2-20}$-unsaturated aliphatic moiety; each R$^1$ and each $R^2$ are independently chosen from H, OR, $C_{1-30}$-hydrocarbyl, substituted $C_{1-30}$-hydrocarbyl, —C(=O)—O—$R^5$, SR, S(=O)R, S(=O)$_2$R, N($R^5$)($R^6$), and N(R7)C(=O)$R^5$; one $R^1$ and one $R^2$ and Z may be taken together along with the atoms to which they are attached to form a 5 to 6-membered ring; $R^3$ and $R^4$ are independently chosen from $C_{1-20}$-alkyl and $C_{5-30}$-aryl; $R^3$ and $R^4$ may be taken together with the carbon to which they are attached to form a 5- or 6-membered ring which may be fused to one or more aromatic rings, and which 5- or 6-membered ring is optionally substituted; $R^5$ and $R^6$ are independently $C_{1-20}$-alkyl or $C_{5-30}$-aryl; $R^7$ is H or $R^6$; $R^5$ and $R^6$ may be taken together along with the atoms to which they are attached to form a 5- to 6-membered ring; each of a1 and a2 is from 0 to 5; each of m1 and m2=1 to 100; and n=2 to 1000. Preferred $C_{1-100}$-hydrocarbylene moieties for Z are $C_{1-50}$-alkylene, $C_{2-50}$-alkenylene, $C_{2-50}$-alkynylene, and $C_{5-30}$-arylene, and more preferably $C_{1-20}$-alkylene, $C_{2-20}$-alkenylene, $C_{2-20}$-alkynylene, and $C_{5-30}$-arylene. It is preferred that Z is a covalent chemical bond or a divalent linking group chosen from O, C(=O), S, S(=O), S(=O)$_2$, N(R), $C_{1-50}$-hydrocarbylene, —O—($C_{1-20}$-alkylene-O—)$_{m1}$, —O—($C_{5-60}$-arylene-O—)$_{m2}$, and C($R^3$)($R^4$), more preferably a covalent chemical bond or a divalent linking group chosen from O, C(=O), S, S(=O)$_2$, $C_{1-50}$-hydrocarbylene, —O—($C_{5-60}$-arylene-O—)$_{m2}$, and C($R^3$)($R^4$), yet more preferably from a covalent chemical bond, O, C(=O), S, S(=O)$_2$, $C_{5-50}$-arylene, —O—($C_{5-60}$-arylene-O—)$_{m2}$, and C($R^3$)($R^4$), and even more preferably from a covalent chemical bond, O, C(=O), S, $C_{5-60}$-arylene, —O—($C_{5-60}$-arylene-O—)$_{m2}$, and C($R^3$)($R^4$). R is preferably chosen from H, $C_{1-20}$-alkyl, and $C_{5-30}$-aryl. Preferably, each of $R^1$ and $R^2$ are independently chosen from H, OR, and $C_{1-30}$-hydrocarbyl, more preferably independently H or $C_{1-30}$-hydrocarbyl, and even more preferably $C_{10-15}$-hydrocarbyl. Yet more preferably, one $R^1$, one $R^2$ and Z are taken together with the atoms to which they are attached to form a 5- or 6-membered ring. Preferred $C_{1-30}$-hydrocarbyl moieties for $R^1$ and $R^2$ are $C_{1-30}$-alkyl, $C_{2-30}$-alkenyl, $C_{2-30}$-alkynyl, and $C_{5-30}$-aryl, and more preferably $C_{1-20}$-alkyl, $C_{1-20}$-alkenyl, $C_{2-20}$-alkynyl, and $C_{5-30}$-aryl. It is preferred that each of a1 and a2=0 to 2, more preferably 0 or 1. In a preferred embodiment, a1=a2, and even more preferably a1=a2=0 or 1. It will be understood by those skilled in the art that each of subscripts n, m1, and m2 refer to the number of repeating units. Preferably, each of m1 and m2 is from 1 to 50, more preferably from 1 to 25, and even more preferably from 1 to 10. It is preferred that n=2 to 500, more preferably 2 to 100, even more preferably 2 to 50, and yet more preferably 2 to 20.

Preferred compounds of formula (1) are those wherein each of a1 and a2 are 0 or 1; and Z=a single covalent bond, O, phenylene, pyrenylene, anthracenylene, phenanthracenylene, —O— phenylene-O—, —O-naphthylene-O—, —C($R^3$)($R^4$), and —O-phenylene-C($R^3$)($R^4$)-phenylene-O—. One preferred divalent linking group when Z=—C($R^3$)($R^4$)— is a fluorenyl moiety of the following formula

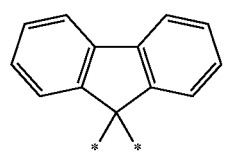 [SMILES: *C1(*)c2ccccc2-c2ccccc21]

wherein * denotes the point of attachment to the moiety of formula (1). When Z=O, it is further preferred that one $R^1$ and one $R^2$ are taken together to form a 6-membered fused heterocyclic ring, and more preferably one $R^1$ and one $R^2$ are taken together to form a moiety of the following formula

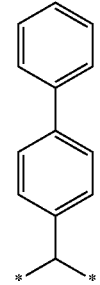 [SMILES: *C(*)c1ccc(-c2ccccc2)cc1]

wherein * denotes the point of attachment to the moiety of formula (1).

The curable compounds of the invention are typically prepared by the oxidative coupling polymerization of a monomer having a 2-naphthol moiety using a copper chloride-amine complex as a catalyst. A preferred catalyst is di-µ-hydroxo-bis-[(N,N,N',N'-tetramethylethylenediamine)copper(II)]chloride. Such oxidative coupling polymerizations are typically carried out in air at room temperature. A suitable oxidative coupling polymerization is disclosed in S. Amou et al., "Synthesis of Regiocontrolled Polymer Having 2-Naphthol Unit by CuCl-amine Catalyzed Oxidative Coupling Polymerization," *Journal of Polymer Science: Part A: polymer Chemistry*, Vol. 37. pp 3702-3709, 1999. Preferred monomers having a 2-naphthol moiety useful to prepare the present curable polymers are compounds of formula (2)

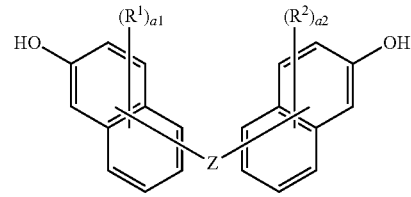

wherein $R^1$, $R^2$, Z, a1, and a2 are as described above for formula (1), and wherein the 1-position is unsubstituted. The monomers of formula (2) are polymerized to form a curable polymer having repeating units of formula (1). The monomers of formula (2) must be unsubstituted at the 1-position. The monomers of formula (2) couple (that is, polymerize) at the 1-position of the 2-naphthol moiety, as shown in the repeating unit of formula (1). The present curable polymers are homopolymers, where each end of the polymer terminates in an unreacted 2-naphthol moiety. Preferred monomers of formula (2) are those of formula (2-1)

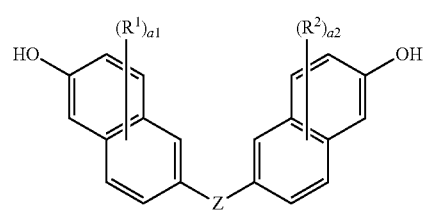

wherein $R^1$, $R^2$, Z, a1, and a2 are as described above for formula (1), and wherein the 1-position is unsubstituted. Preferred monomers of formula (2-1) are those of formulae (2a) to (2f).

(2a)
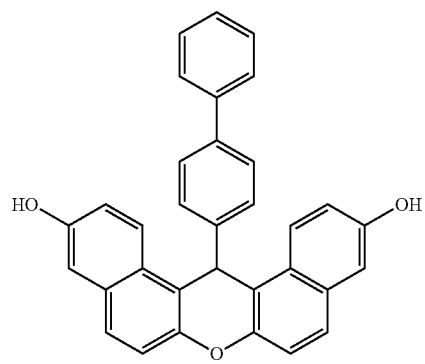

(2b)
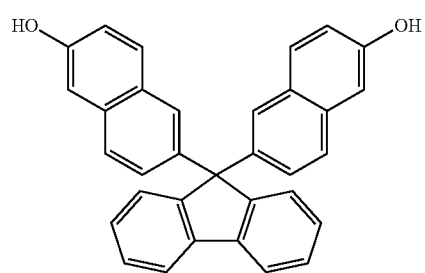

(2c)
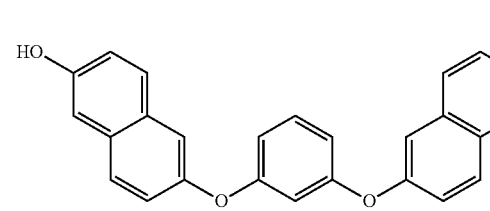

(2d)
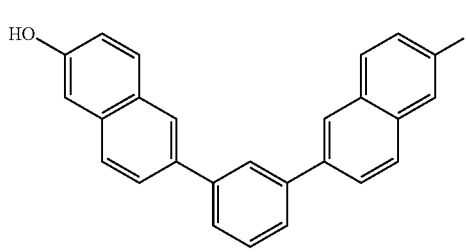

(2e)
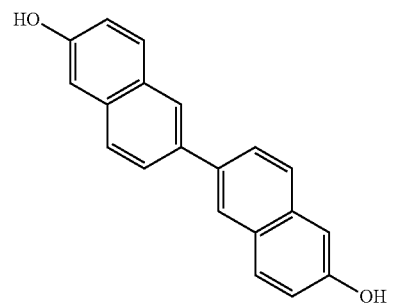

-continued (2f)
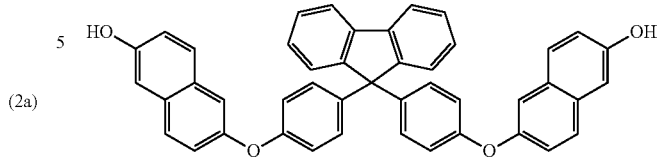

Monomers (2a) to (2f) are used to prepare polymers having repeating units (1a) to (1f), respectively, where n in each instance refers to the degree of polymerization or the number of repeat units (n=2 to 1000).

(1a)
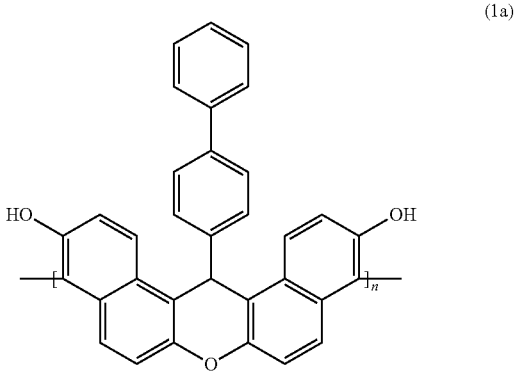

(1b)
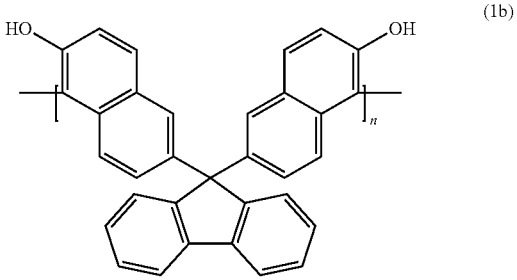

(1c)
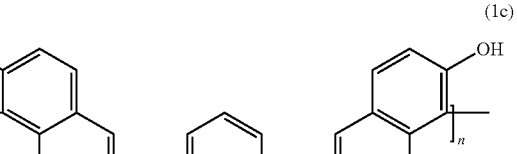

(1d)
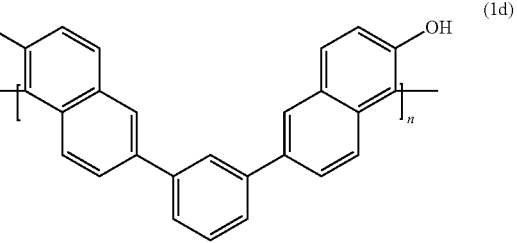

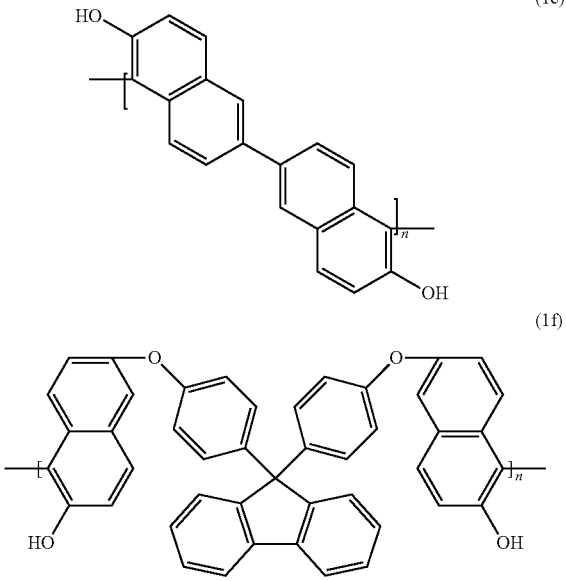

In addition to the one or more curable compounds described above, the present coating compositions may optionally comprise, and preferably do comprise, one or more organic solvents. Suitable organic solvents are any that dissolve the one or more curable compounds, and preferably are organic solvents conventionally used in the manufacture of electronic devices. Organic solvents may be used alone or a mixture of organic solvents may be used. Suitable organic solvents include, but are not limited to; ketones such as cyclohexanone and 2-heptanone; alcohols such as 3-methoxybutanol, 3-methyl-3-methoxybutanol, 1-methoxy-2-propanol, and 1-ethoxy-2-propanol; ethers such as propylene glycol methyl ether (PGME), propylene glycol ethyl ether (PGEE), ethylene glycol monomethyl ether, propylene glycol monoethyl ether, ethylene glycol monoethyl ether, propylene glycol dimethyl ether, and diethylene glycol dimethyl ether, anisole; esters such as propylene glycol monomethyl ether acetate (PGMEA), propylene glycol monoethyl ether acetate, ethyl lactate (EL), methyl hydroxyisobutyrate (HBM), ethyl pyruvate, butyl acetate, methyl 3-methoxypropionate, ethyl 3-ethoxypropionate, tert-butyl acetate, tert-butyl propionate, and propylene glycol mono-tert-butyl ether acetate; lactones such as gamma-butyrolactone; and any combination of the foregoing. Preferred solvents are PGME, PGEE, PGMEA, EL, HBM, and combinations thereof.

The present coating compositions may also comprise one or more coating additives that are typically used in such coatings, such as curing agents, crosslinking agents, surface leveling agents, and the like. The selection of such optional additives and their amounts are well within the ability of those skilled in the art. Curing agents are typically present in an amount of from 0 to 20 wt % based on total solids, and preferably from 0 to 3 wt %. Crosslinking agents are typically used in an amount of from 0 to 30 wt % based on total solids, and preferably from 3 to 10 wt %. Surface leveling agents are typically used in an amount of from 0 to 5 wt % based on total solids, and preferably from 0 to 1 wt %. The selection of such optional additives and their amounts used are within the ability of those skilled in the art.

Curing agents may optionally be used in the coating compositions to aid in the curing of the deposited curable compound. A curing agent is any component which causes curing of the curable compound on the surface of the substrate. Preferred curing agents are acids and thermal acid generators. Suitable acids include, but are not limited to: arylsulfonic acids such as p-toluenesulfonic acid; alkyl sulfonic acids such as methanesulfonic acid, ethanesulfonic acid, and propanesulfonic acid; perfluoroalkylsulfonic acids such as trifluoromethanesulfonic acid; and perfluoroarylsulfonic acids. A thermal acid generator is any compound which liberates acid upon exposure to heat. Thermal acid generators are well-known in the art and are generally commercially available, such as from King Industries, Norwalk, Conn. Exemplary thermal acid generators include, without limitation, amine blocked strong acids, such as amine blocked sulfonic acids such as amine blocked dodecylbenzenesulfonic acid. It will also be appreciated by those skilled in the art that certain photoacid generators are able to liberate acid upon heating and may function as thermal acid generators.

Any suitable crosslinking agent may be used in the present compositions, provided that such crosslinking agent has at least 2, and preferably at least 3, moieties capable of reacting with the present aromatic resin reaction products under suitable conditions, such as under acidic conditions. Exemplary crosslinking agents include, but are not limited to, novolac resins, epoxy-containing compounds, melamine compounds, guanamine compounds, isocyanate-containing compounds, benzocyclobutenes, and the like, and preferably any of the foregoing having 2 or more, preferably 3 or more, and more preferably 4, substituents selected from methylol, $C_1$-$C_{10}$alkoxymethyl, and $C_2$-$C_{10}$acyloxymethyl. Examples of suitable crosslinking agents are those shown by formulae (3) and (4).

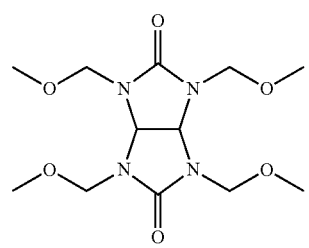

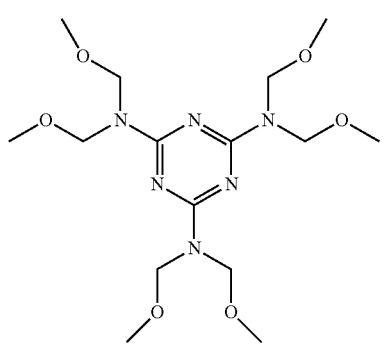

Such crosslinking agents are well-known in the art, and are commercially available from a variety of sources.

The present coating compositions may optionally include one or more surface leveling agents (or surfactants). While any suitable surfactant may be used, such surfactants are typically non-ionic. Exemplary non-ionic surfactants are those containing an alkyleneoxy linkage, such as ethyleneoxy, propyleneoxy, or a combination of ethyleneoxy and propyleneoxy linkages.

The present coating compositions may be coated on an electronic device substrate by any suitable means, such as spin-coating, slot-die coating, doctor blading, curtain coating, roller coating, spray coating, dip coating, and the like. Spin-coating is preferred. In a typical spin-coating method, the present compositions are applied to a substrate which is spinning at a rate of 500 to 4000 rpm for a period of 15 to 90 seconds to obtain a desired layer of the coating composition on the electronic device substrate. It will be appreciated by those skilled in the art that the height of the coating composition layer may be adjusted by changing the spin speed.

After being coated on the substrate, the coating composition layer is optionally baked at a relatively low temperature to remove any organic solvent and other relatively volatile components from the layer. Typically, the substrate is baked at a temperature of 80 to 150° C., although other suitable temperatures may be used. The baking time is typically from 10 seconds to 10 minutes, and preferably from 30 seconds to 5 minutes, although longer or shorter times may be used. When the substrate is a wafer, such baking step may be performed by heating the wafer on a hot plate. Following solvent removal, a layer, film or coating of the curable compound on the substrate surface is obtained.

The curable compound layer is then sufficiently cured to form an aromatic underlayer such that the film does not intermix with a subsequently applied coating layer, such as a photoresist or other layer coated directly on the aromatic underlayer. The underlayer may be cured in an oxygen-containing atmosphere, such as air, or in an inert atmosphere, such as nitrogen, and preferably in an oxygen-containing atmosphere. The curing conditions used are those sufficient to cure the film such that it does not intermix with a subsequently applied organic layer, such as a photoresist layer, while still maintaining the desired antireflective properties (n and k values), etch selectivity, gap fill, and planarization of the underlayer film. This curing step is conducted preferably on a hot plate-style apparatus, though oven curing may be used to obtain equivalent results. Typically, such curing is performed by heating the underlayer at a curing temperature of ≥150° C., preferably ≥170° C., and more preferably ≥200° C. The curing temperature selected should be sufficient to cure the aromatic underlayer. A suitable temperature rage for curing the aromatic underlayer is 150 to 400° C. preferably from 170 to 350° C., and more preferably from 200 to 250° C. Such curing step may take from 10 sec. to 10 min., preferably from 1 to 3 min., and more preferably from 1 to 2 min., although other suitable times may be used.

The initial baking step may not be necessary if the curing step is conducted in such a way that rapid evolution of the solvents and curing by-products is not allowed to disrupt the underlayer film quality. For example, a ramped bake beginning at relatively low temperatures and then gradually increasing to a temperature of ≥200° C. can give acceptable results. It can be preferable in some cases to have a two-stage curing process, with the first stage being a lower bake temperature of less than 150° C., and the second stage being a higher bake temperature of ≥200° C. Two stage curing processes facilitate uniform filling and planarization of pre-existing substrate surface topography, for example filling of trenches and vias.

After curing of the underlayer, one or more processing layers, such as photoresists, silicon-containing layers, hardmask layers, bottom antireflective coating (or BARC) layers, and the like, may be coated on the cured underlayer. For example, a photoresist may be coated, such as by spin coating, directly on the surface of a silicon-containing layer or other middle layer which is directly on the resin underlayer, or, alternatively, the photoresist may be coated directly on the cured underlayer. A wide variety of photoresists may be suitably used, such as those used in 193 nm lithography, such as those sold under the EPIC™ brand available from Dow Electronic Materials (Marlborough, Mass.). Suitable photoresists may be either positive tone development or negative tone development resists. Following coating, the photoresist layer is then imaged (exposed) using patterned actinic radiation, and the exposed photoresist layer is then developed using the appropriate developer to provide a patterned photoresist layer. The pattern is next transferred from the photoresist layer to the underlayers by an appropriate etching techniques. Typically, the photoresist is also removed during such etching step. Next, the pattern is transferred to the substrate and the underlayer removed by appropriate etching techniques known in the art, such as by plasma etching. Following patterning of the substrate, the underlayer is removed using conventional techniques. The electronic device substrate is then processed according to conventional means.

The cured underlayer may be used as the bottom layer of a multilayer resist process. In such a process, a layer of the coating composition is coated on a substrate and cured as described above. Next, one or more middle layers are coated on the aromatic underlayer. For example, a silicon-containing layer or a hardmask layer is coated directly on the aromatic underlayer. Exemplary silicon-containing layers, such as a silicon-BARC, may be deposited by spin coating on the underlayer followed by curing, or an inorganic silicon layer such as SiON, SiN, or $SiO_2$ may be deposited on the underlayer by chemical vapor deposition (CVD). Any suitable hardmask may be used and may be deposited on the underlayer by any suitable technique, and cured as appropriate. Optionally, an organic BARC layer may be disposed directly on the silicon-containing layer or hardmask layer, and appropriately cured. Next, a photoresist, such as those used in 193 nm lithography, is coated directly on the silicon-containing layer (in a trilayer process) or directly on the organic BARC layer (in a quadlayer process). The photoresist layer is then imaged (exposed) using patterned actinic radiation, and the exposed photoresist layer is then developed using the appropriate developer to provide a patterned photoresist layer. The pattern is next transferred from the photoresist layer to the layer directly below it, by appropriate etching techniques known in the art, such as by plasma etching, resulting in a patterned silicon-containing layer in a trilayer process and a patterned organic BARC layer in a quadlayer process. If a quadlayer process is used, the pattern is next transferred from the organic BARC layer to the silicon-containing layer or hardmask layer using appropriate pattern transfer techniques, such as plasma etching. After the silicon-containing layer or hardmask layer is patterned, the aromatic underlayer is then patterned using appropriate etching techniques, such as $O_2$ or $CF_4$ plasma. Any remaining patterned photoresist and organic BARC layers are removed during etching of the aromatic underlayer. Next, the pattern is transferred to the substrate, such as by appropriate etching techniques, which also removes any remaining silicon-containing layer or hardmask layer, followed by removal of any remaining patterned aromatic underlayer to provide a patterned substrate.

The cured underlayer of the present invention may also be used in a self-aligned double patterning process. In such a process, a layer of the present coating composition is coated on a substrate, such as by spin-coating. Any remaining organic solvent is removed and the coating composition layer is cured to form a cured underlayer. A suitable middle layer, such as a silicon-containing layer is coated on the cured underlayer. A layer of a suitable photoresist is then coated on the middle layer, such as by spin coating. The photoresist layer is then imaged (exposed) using patterned actinic radiation, and the exposed photoresist layer is then developed using the appropriate developer to provide a patterned photoresist layer. The pattern is next transferred from the photoresist layer to the middle layer and the cured underlayer by appropriate etching techniques to expose portions of the substrate. Typically, the photoresist is also removed during such etching step. Next, a conformal silicon-containing layer is disposed over the patterned cured underlayer and exposed portions of the substrate. Such silicon-containing layer is typically an inorganic silicon layer such as SiON, SiN, or $SiO_2$ which is conventionally deposited by CVD. Such conformal coatings result in a silicon-containing layer on the exposed portions of the substrate surface as well as over the underlayer pattern, that is, such silicon-containing layer substantially covers the sides and top of the patterned underlayer. Next, the silicon-containing layer is partially etched (trimmed) to expose a top surface of the patterned polyarylene resin underlayer and a portion of the substrate. Following this partial etching step, the pattern on the substrate comprises a plurality of features, each feature comprising a line or post of the cured underlayer with the silicon-containing layer directly adjacent to the sides of each cured underlayer feature. Next, the cured underlayer is removed, such as by etching, to expose the substrate surface that was under the cured underlayer pattern, and providing a patterned silicon-containing layer on the substrate surface, where such patterned silicon-containing layer is doubled (that is, twice as many lines and/or posts) as compared to the patterned cured underlayer.

The coating compositions of the invention are also useful in forming planarizing layers, gap filling layers, and protective layers in the manufacture of integrated circuits. When used as such planarizing layers, gap filling layers, or protective layers, one or more intervening material layers, such as silicon-containing layers, other aromatic resin layers, hardmask layers, and the like, are typically present between the cured layer of the present coating composition and any photoresist layer. Typically, such planarizing layers, gap filling layers, and protective layers are ultimately patterned. A gap-filling process according to the invention comprises: (a) providing a semiconductor substrate having a relief image on a surface of the substrate, the relief image comprising a plurality of gaps to be filled: (b) applying a gap-fill composition over the relief image, wherein the gap-fill composition comprises one or more curable compounds comprising repeating units of formula (1)

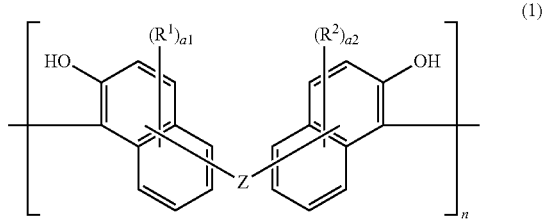

wherein Z is a covalent chemical bond or a divalent linking group chosen from O, C(=O), S, S(=O), S(=O)$_2$, N(R), $C_{1-100}$-hydrocarbylene, substituted $C_{1-100}$-hydrocarbylene, —O—($C_{1-20}$-alkylene-O—)$_{m1}$, —O—($C_{5-60}$-arylene-O—)$_{m2}$, and C(R$^3$)(R$^4$); R is chosen from H, $C_{1-20}$-alkyl, $C_{5-30}$-aryl, and $C_{2-20}$-unsaturated aliphatic moiety; each R$^1$ and each R$^2$ are independently chosen from H, OR, $C_{1-30}$-hydrocarbyl, substituted $C_{1-30}$-hydrocarbyl, —C(=O)—O—R$^5$, SR, S(=O)R, S(=O)$_2$R, N(R$^5$)(R$^6$), and N(R7)C(=O)R$^5$; one R$^1$ and one R$^2$ and Z may be taken together along with the atoms to which they are attached to form a 5 to 6-membered ring; R$^3$ and R$^4$ are independently chosen from $C_{1-20}$-alkyl and $C_{5-30}$-aryl; R$^3$ and R$^4$ may be taken together with the carbon to which they are attached to form a 5- or 6-membered ring which may be fused to one or more aromatic rings, and which 5- or 6-membered ring is optionally substituted; R$^5$ and R$^6$ are independently $C_{1-20}$-alkyl or $C_{5-30}$-aryl; R$^7$ is H or R$^6$; R$^5$ and R$^6$ may be taken together along with the atoms to which they are attached to form a 5- to 6-membered ring; each of a1 and a2 is from 0 to 5; each of m1 and m2=1 to 100; and n=2 to 1000; and (ii) one or more organic solvents; and (c) heating the gap-fill composition at a temperature to cure the one or more curable compounds. The present compositions substantially fill, preferably fill, and more preferably fully fill, a plurality of gaps in a semiconductor substrate.

The compounds of the invention have good gap-filling properties. Films formed from the compounds of the invention have good planarization, and solvent resistance.

EXAMPLE 1

Monomer M-1 (4.66 g, 10 mmol) was dissolved in 41.71 g of ethyl lactate. To this solution was added 0.23 g (0.5 mmol) of di-µ-hydroxo-bis-[(N,N,N',N'-tetramethylethylene-diamine)copper(II)] chloride (Cu-TMEDA), and the reaction mixture was stirred in air at room temperature for 24 hours. The mixture was slowly added to a mixture of methanol containing 1 M hydrochloric acid (200 mL, v/v=20/80). The precipitated product was collected by filtration, and then re-dissolved in ethyl acetate. The solution was then slowly added to methanol, and the precipitated product was collected, and dried at 65° C. under vacuum for 2 days. Polymer P-1A (3.2 g) was obtained in 69% yield. GPC: $M_w$=1.9 K, PDI=1.4. This reaction is shown in Reaction Scheme 1.

EXAMPLE 2

The procedure of Example 1 was repeated as follows. Monomer M-1 (4.66 g, 10 mmol) was dissolved in 43.80 g of ethyl lactate. To this solution was added 0.46 g (1.0 mmol) of Cu-TMEDA, and the reaction mixture was stirred in air at room temperature for 24 hours. The mixture was slowly added to a mixture of methanol containing 1 M hydrochloric acid (200 mL, v/v=20/80). The precipitated product was collected by filtration, and then re-dissolved in ethyl acetate. The solution was then slowly added to methanol, and the precipitated product was collected, and dried at 65° C. under vacuum for 2 days. Polymer P-1B (3.61 g) was obtained in 78% yield. GPC: $M_w$=3.6 K, PDI=1.5. This reaction is shown in Reaction Scheme 1.

Reaction Scheme 1

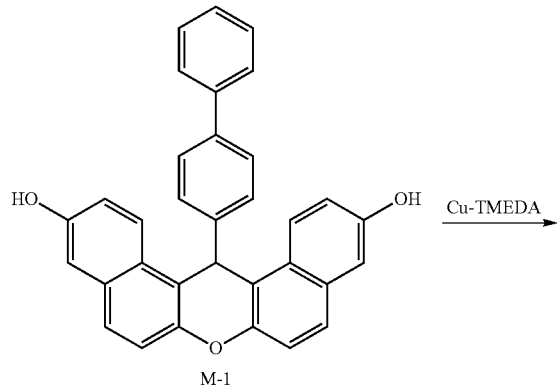

M-1

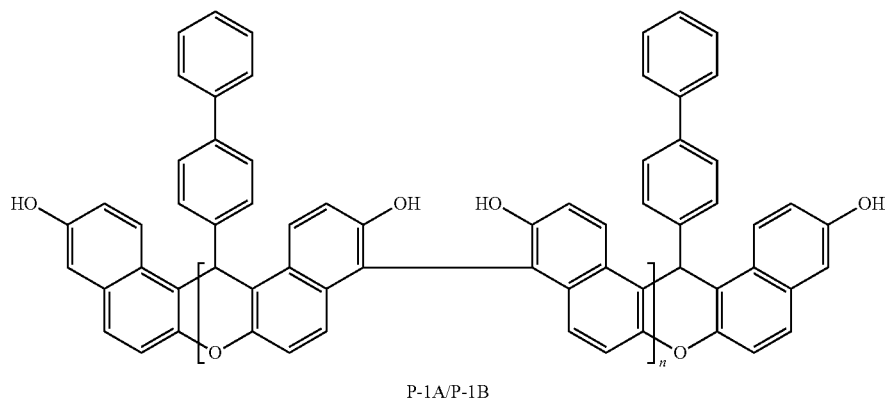

P-1A/P-1B

EXAMPLE 3

Monomer M-2 (4.51 g, 10 mmol) was dissolved in 44.73 g of ethyl lactate. To this solution was added 0.46 g (1.0 mmol) of Cu-TMEDA, and the reaction mixture was stirred in the open air at room temperature for 24 hours. The mixture was slowly added to a mixture of methanol containing 1 M hydrochloric acid (200 mL, v/v=20/80). The precipitated product was collected by filtration, and then re-dissolved in ethyl acetate. The solution was then slowly added to methanol, the precipitated product was collected, and dried at 65° C. under vacuum for 2 days to yield Polymer P-2 (3.79 g) in 84% yield. GPC: $M_w$=2.2 K, PDI=1.6. This reaction is shown in Reaction Scheme 2.

Reaction Scheme 2

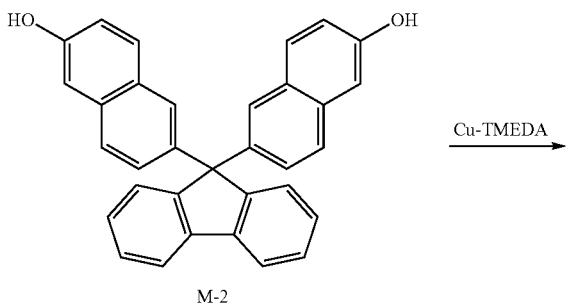

M-2

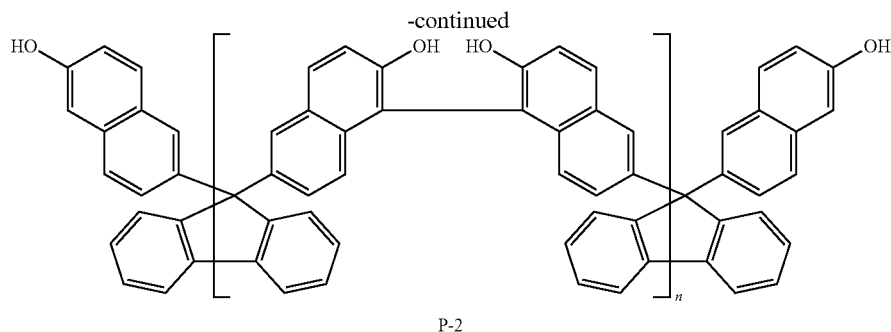

P-2

EXAMPLE 4

Monomer M-3 (3.94 g, 10 mmol) was dissolved in 17.64 g of ethyl lactate. To this solution was added 0.46 g (1.0 mmol) of Cu-TMEDA, and the reaction mixture was stirred in air at room temperature for 24 hours. The mixture was slowly added to a mixture of methanol containing 1 M hydrochloric acid (200 mL, v/v=20/80). The precipitated product was collected by filtration, and then re-dissolved in ethyl acetate. The solution was then slowly added to methanol, the precipitated product was collected, and dried at 65° C. under vacuum for 2 days to provide 3.10 g of Polymer P-3 in 79% yield. GPC: $M_w$=195 K, PDI=19. This reaction is shown in Reaction Scheme 3.

Reaction Scheme 3

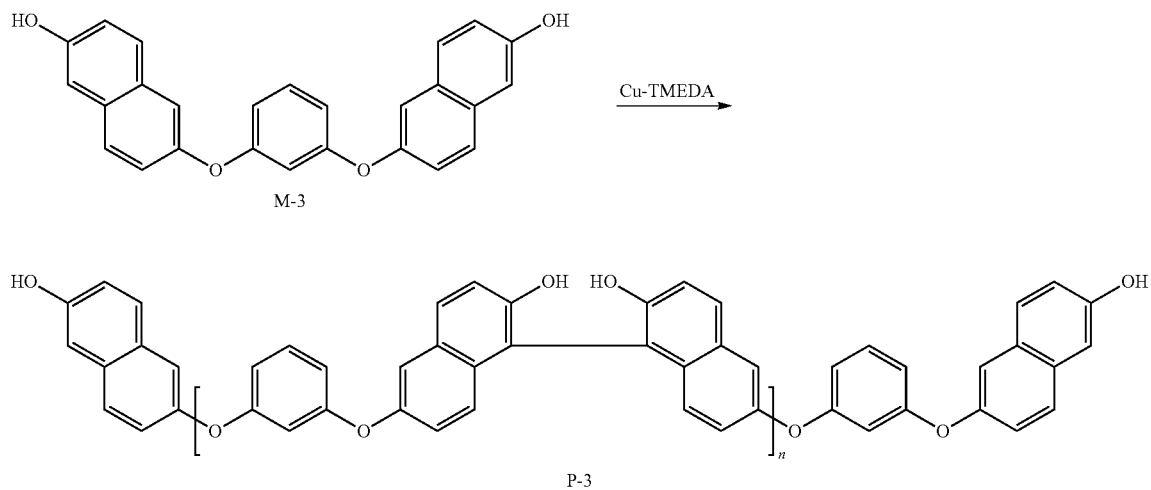

EXAMPLE 5

Monomer M-4 (6.35 g, 10 mmol) was dissolved in 27.25 g of ethyl lactate. To this solution was added 0.46 g (1.0 mmol) of Cu-TMEDA, and the reaction mixture was stirred in air at room temperature for 24 hours. The mixture was slowly added to a mixture of methanol containing 1 M hydrochloric acid (200 mL, v/v=20/80). The precipitated product was collected by filtration, and then re-dissolved in ethyl acetate. The solution was then slowly added to methanol, the precipitated product was collected, and dried at 65° C. under vacuum for 2 days to give 5.31 g of Polymer P-4 in 83% yield. GPC: $M_w$=3.0 K. PDI=1.5. This reaction is shown in Reaction Scheme 4.

Reaction Scheme 4

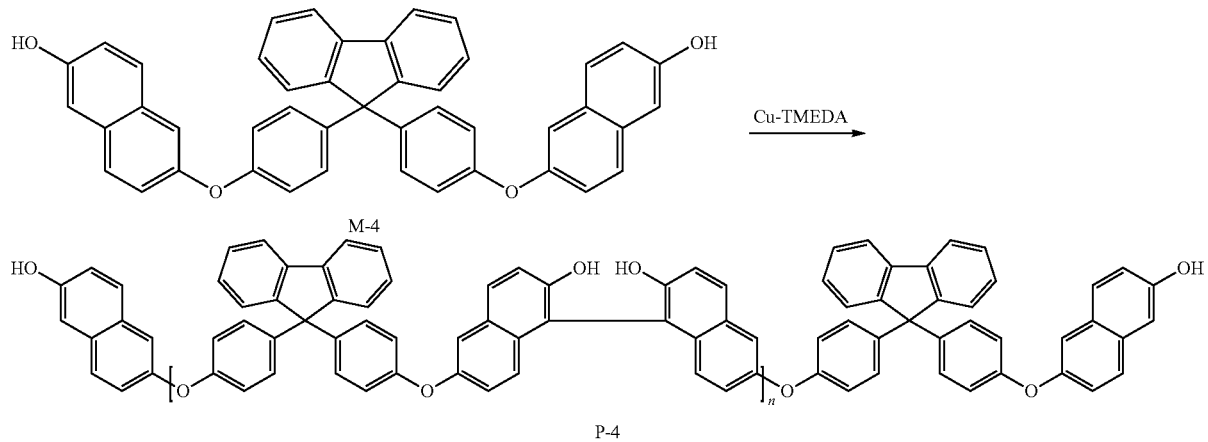

EXAMPLE 6: SOLUBILITY

Solubility was evaluated by mixing a compound of the invention with each of PGME and PGMEA at 5% solids. Those mixtures were visibly inspected as well as checked using a turbidity meter (Orbeco-Hellige Co). If the turbidity value was less than 1, the compound was rated soluble ("S") and if the turbidity value was greater than 1, it was rated not soluble ("NS"). The results are reported in Table 1. As can be seen from these data, the compounds of the invention are all soluble in each of PGME and PGMEA.

TABLE 1

| | Solubility (5% solids) | |
|---|---|---|
| Entry No. | Polymer | PGMEA | PGME |
| 1 | P-1A | S | S |
| 2 | P-1B | S | S |
| 3 | P-2 | S | S |
| 4 | P-3 | S | S |
| 5 | P-4 | S | S |

EXAMPLE 7: THERMAL STABILITY

Thermal stability of compounds of the invention was evaluated using a Thermal Gravimetric Analyzer (TGA) Q500 from TA-Instrument, under the following conditions: under $N_2$, ramp at 10° C./min. to 700° C.; and under air, ramp at 10° C./min. to 700° C. The temperature at which the materials lost 5% of their weight ("$Td_{5\%}$") are reported in Table 2.

TABLE 2

| | | $Td_{5\%}$ (° C.) | |
|---|---|---|---|
| Entry No. | Polymer | Under $N_2$ | Under Air |
| 1 | P-1A | 465 | 380 |
| 2 | P-1B | 467 | 367 |
| 3 | P-2 | 442 | 412 |
| 4 | P-3 | 427 | 414 |
| 5 | P-4 | 446 | 454 |

EXAMPLE 8

Solvent strip resistance was measured as an indication of film crosslinking. Compositions of compounds of the invention were prepared in PGMEA at 4.5% solids. Each composition was spin-coated on an 8" (200 mm) silicon wafer at a rate of 1500 rpm using an ACT-8 Clean Track (Tokyo Electron Co.), and then baked at 350° C. for 60 seconds to form a film. Initial film thickness was measured using an OptiProbe™ from Therma-Wave Co. Next, a commercial remover, PGMEA was applied to each of the films for 90 seconds followed by a post strip baking step at 105° C. for 60 seconds. The thickness of each film following post strip baking was again measured to determine the amount of film thickness lost. The difference in film thickness before and after contact with the remover is reported in Table 3 as the percentage of film thickness remaining. As can be seen from the data, films formed from polymer P-3 and P-4 of the invention retained greater than 99% of their thickness after contact with the remover.

TABLE 3

| Entry No. | Polymer | % Film Remaining |
|---|---|---|
| 1 | P-1A | 32.8 |
| 2 | P-1B | 39.7 |
| 3 | P-2 | 4.7 |
| 4 | P-3 | >99 |
| 5 | P-4 | >99 |

EXAMPLE 9

Polymers of the invention were evaluated to determine their gap-filling properties. Gap fill templates were created at CNSE Nano-FAB (Albany, N.Y.). The template had $SiO_2$ film thickness of 100 nm, and various pitch and patterns. The template coupons were baked at 150° C. for 60 seconds as a dehydration bake prior to coating the coupons with the present compositions. Each coating composition (4.5% solids in PGMEA) was coated on a template coupon using an ACT-8 Clean Track (Tokyo Electron Co.) spin coater and a spin rate of 1500 rpm+/−200 rpm. The target film thickness was 100 nm after curing, and the composition dilution was adjusted accordingly to give approximately the target film thickness after curing. The films were cured by placing the wafer on a hot plate at 350° C. for 60 sec. Cross-section scanning electron microscope (SEM) images of the coated coupons were collected using an Hitachi S4800 SEM (from Hitachi High Technologies). Planarization quality of the films was obtained from the SEM images using Hitachi offline CD measurement software or CDM software by measuring the difference in thickness of the film (ΔFT) over vias from the film thickness over trenches. Films having a ΔFT<20 nm were considered to have "Good" planarization and films having a ΔFT>20 nm were considered to have "Poor" planarization. Gap filling was evaluated by visually inspecting the SEM images to see if there were any voids or bubbles in the trench patterns. Films having no voids in the trench patterns were considered to have "Good" gap fill and films having voids in the trench patters were considered to have "Poor" gap fill. These results are reported in Table 4.

TABLE 4

| Sample No. | Polymer | Planarization | Gap Fill |
|---|---|---|---|
| 1 | P-1A | Poor | Poor |
| 2 | P-1B | Poor | Poor |
| 3 | P-2 | Poor | Poor |
| 4 | P-3 | Good | Good |
| 5 | P-4 | Good | Good |

What is claimed is:

1. A method comprising: (a) providing an electronic device substrate; (b) coating a layer of a coating composition comprising one or more curable compounds on a surface of the electronic device substrate, wherein the one or more curable compounds is a polymer comprising repeating units of formula (1)

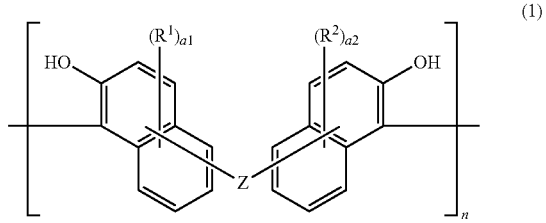

wherein Z is a covalent chemical bond or a divalent linking group chosen from O, C(=O), S, S(=O), S(=O)$_2$, N(R), C$_{1-100}$-hydrocarbylene, substituted C$_{1-100}$-hydrocarbylene, —O—(C$_{1-20}$-alkylene-O—)$_{m1}$, —O—(C$_{5-60}$-arylene-O—)$_{m2}$, and C(R$^3$)(R$^4$); R is chosen from H, C$_{1-20}$-alkyl, C$_{5-30}$-aryl, and C$_{2-20}$-unsaturated aliphatic moiety; each R$^1$ and each R$^2$ are independently chosen from H, OR, C$_{1-30}$-hydrocarbyl, substituted C$_{1-30}$-hydrocarbyl, —C(=O)—O—R$^5$, SR, S(=O)R, S(=O)$_2$R, N(R$^5$)(R$^6$), and N(R$^7$)C(=O)R$^5$; one R$^1$ and one R$^2$ and Z may be taken together along with the atoms to which they are attached to form a 5 to 6-membered ring; R$^3$ and R$^4$ are independently chosen from C$_{1-20}$-alkyl and C$_{5-30}$-aryl; R$^5$ and R$^6$ are independently C$_{1-20}$-alkyl or C$_{5-30}$-aryl; R$^7$ is H or R$^6$; R$^5$ and R$^6$ may be taken together along with the atoms to which they are attached to form a 5- to 6-membered ring; each of a1 and a2 is from 0 to 5; each of m1 and m2=1 to 100; and n=2 to 1000; wherein a first 2-naphthol moiety of a first repeating unit of formula (1) is bonded by a single bond to a second 2-naphthol moiety of a second repeating unit of formula (1) at the respective 1-position of the first 2-naphthol moiety and second 2-naphthol moiety; (c) curing the layer of the curable compound to form an underlayer; (d) coating a layer of a photoresist on the underlayer; (e) exposing the photoresist layer to actinic radiation through a mask; (f) developing the exposed photoresist layer to form a resist pattern; and (g) transferring the pattern to the underlayer to expose portions of the electronic device substrate.

2. The method of claim 1 further comprising the steps of patterning the substrate; and then removing the patterned underlayer.

3. The method of claim 1 further comprising the step of coating one or more of a silicon-containing layer, an organic antireflective coating layer and a combination thereof over the underlayer before step (d).

4. The method of claim 3 further comprising the step of transferring the pattern to the one or more of the silicon-containing layer, the organic antireflective coating layer and the combination thereof after step (f) and before step (g).

5. The method of claim 1 wherein the coating composition further comprises one or more of an organic solvent, a curing agent, and a surface leveling agent.

6. The method of claim 1 wherein the repeating units of formula (1) are chosen from formulae:

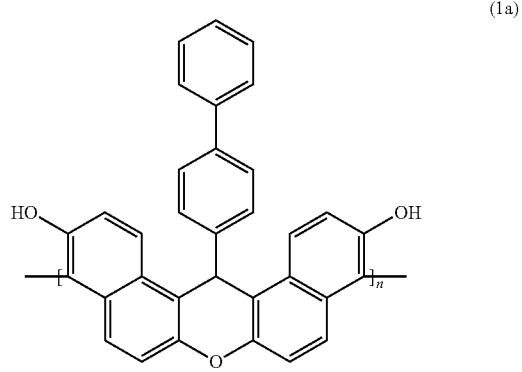

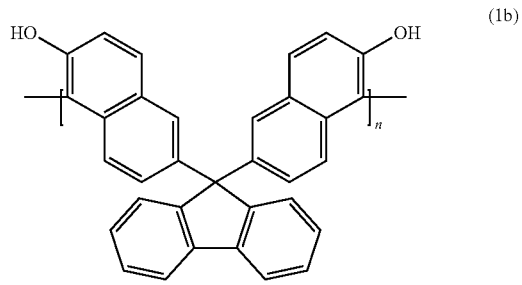

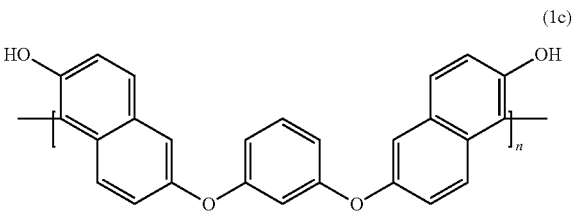

-continued

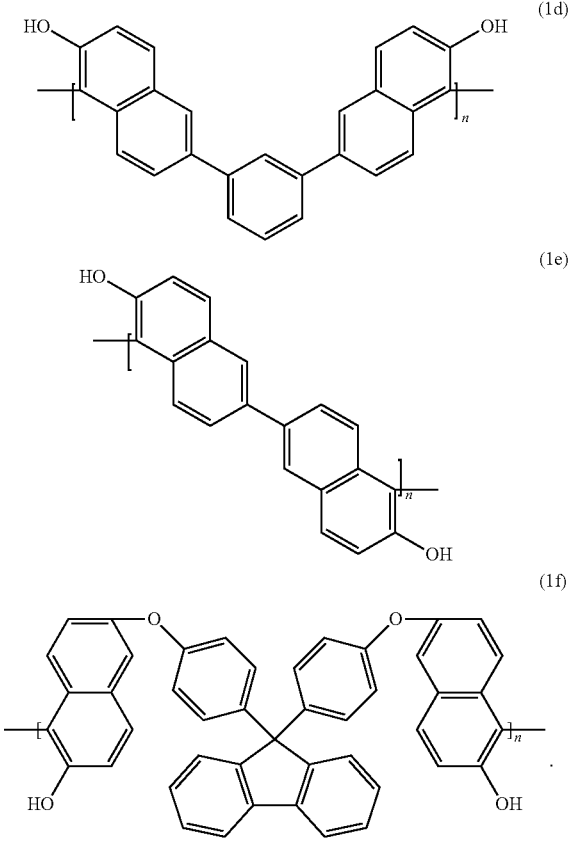

7. An electronic device comprising an electronic device substrate having a layer of a polymer comprising as polymerized units one or more curable compounds on a surface of the electronic device substrate, wherein the one or more curable compounds is a polymer comprising repeating units of formula (1)

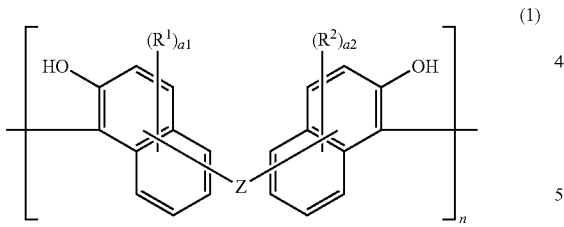

wherein Z is a covalent chemical bond or a divalent linking group chosen from O, C(=O), S, S(=O), S(=O)$_2$, N(R), $C_{1-100}$-hydrocarbylene, substituted $C_{1-100}$-hydrocarbylene, —O—($C_{1-20}$-alkylene-O—)$_{m1}$, —O—($C_{5-60}$-arylene-O—)$_{m2}$, and C(R$^3$)(R$^4$); R is chosen from H, $C_{1-20}$-alkyl, $C_{5-30}$-aryl, and $C_{2-20}$-unsaturated aliphatic moiety; each R$^1$ and each R$^2$ are independently chosen from H, OR, $C_{1-30}$-hydrocarbyl, substituted $C_{1-30}$-hydrocarbyl, —C(=O)—O—R$^5$, SR, S(=O)R, S(=O)$_2$R, N(R$^5$)(R$^6$), and N(R7)C(=O)R$^5$; one R$^1$ and one R$^2$ and Z may be taken together along with the atoms to which they are attached to form a 5 to 6-membered ring; R$^3$ and R$^4$ are independently chosen from $C_{1-20}$-alkyl and $C_{5-30}$-aryl; R$^5$ and R$^6$ are independently $C_{1-20}$-alkyl or $C_{5-30}$-aryl; R$^7$ is H or R$^6$; R$^5$ and R$^6$ may be taken together along with the atoms to which they are attached to form a 5- to 6-membered ring; each of a1 and a2 is from 0 to 5; each of m1 and m2=1 to 100; and n=2 to 1000; wherein a first 2-naphthol moiety of a first repeating unit of formula (1) is bonded by a single bond to a second 2-naphthol moiety of a second repeating unit of formula (1) at the respective 1-position of the first 2-naphthol moiety and second 2-naphthol moiety.

8. A polymer comprising repeating units of formula (1)

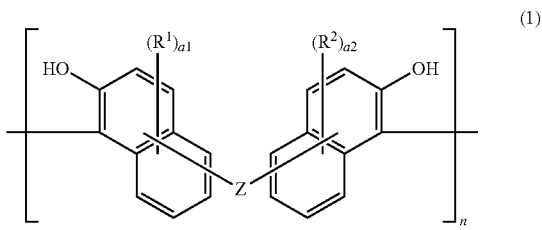

wherein Z is a covalent chemical bond or a divalent linking group chosen from O, C(=O), S, S(=O), S(=O)$_2$, N(R), $C_{1-100}$-hydrocarbylene, substituted $C_{1-100}$-hydrocarbylene, —O—($C_{1-20}$-alkylene-O—)$_{m1}$, —O—($C_{5-60}$-arylene-O—)$_{m2}$, and C(R$^3$)(R$^4$); R is chosen from H, $C_{1-20}$-alkyl, $C_{5-30}$-aryl, and $C_{2-20}$-unsaturated aliphatic moiety; each R$^1$ and each R$^2$ are independently chosen from H, OR, $C_{1-30}$-hydrocarbyl, substituted $C_{1-30}$-hydrocarbyl, —C(=O)—O—R$^5$, SR, S(=O)R, S(=O)$_2$R, N(R$^5$)(R$^6$), and N(R7)C(=O)R$^5$; one R$^1$ and one R$^2$ and Z may be taken together along with the atoms to which they are attached to form a 5 to 6-membered ring; R$^3$ and R$^4$ are independently chosen from $C_{1-20}$-alkyl and $C_{5-30}$-aryl; R$^5$ and R$^6$ are independently $C_{1-20}$-alkyl or $C_{5-30}$-aryl; R$^7$ is H or R$^6$; R$^5$ and R$^6$ may be taken together along with the atoms to which they are attached to form a 5- to 6-membered ring; each of a1 and a2 is from 0 to 5; each of m1 and m2=1 to 100; and n=2 to 1000; wherein a first 2-naphthol moiety of a first repeating unit of formula (1) is bonded by a single bond to a second 2-naphthol moiety of a second repeating unit of formula (1) at the respective 1-position of the first 2-naphthol moiety and second 2-naphthol moiety.

9. The method of claim 1 wherein Z is a covalent chemical bond or a divalent linking group chosen from —O—($C_{5-60}$-arylene-O—)$_{m2}$, and m2=1 to 100.

10. The electronic device of claim 7 wherein Z is a covalent chemical bond or a divalent linking group chosen from —O—($C_{5-60}$-arylene-O—)$_{m2}$, and m2=1 to 100.

11. The polymer of claim 8 wherein Z is a covalent chemical bond or a divalent linking group chosen from —O—($C_{5-60}$-arylene-O—)$_{m2}$, and m2=1 to 100.

* * * * *